United States Patent
Igarashi et al.

(10) Patent No.: US 11,955,188 B2
(45) Date of Patent: Apr. 9, 2024

(54) SEMICONDUCTOR STORAGE DEVICE AND ERASE VERIFICATION METHOD

(71) Applicant: Kioxia Corporation, Tokyo (JP)

(72) Inventors: Hideki Igarashi, Kanagawa (JP); Wataru Makino, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 238 days.

(21) Appl. No.: 17/690,741

(22) Filed: Mar. 9, 2022

(65) Prior Publication Data

US 2023/0075487 A1 Mar. 9, 2023

(30) Foreign Application Priority Data

Sep. 3, 2021 (JP) .................................. 2021-144217

(51) Int. Cl.
*G11C 16/04* (2006.01)
*G11C 16/16* (2006.01)
*G11C 16/34* (2006.01)

(52) U.S. Cl.
CPC ...... *G11C 16/3445* (2013.01); *G11C 16/0483* (2013.01); *G11C 16/16* (2013.01)

(58) Field of Classification Search
CPC . G11C 16/3445; G11C 16/0483; G11C 16/16; G11C 16/08
See application file for complete search history.

(56) References Cited

U.S. PATENT DOCUMENTS

| 5,696,717 A | * | 12/1997 | Koh | ................. G11C 16/3436 365/185.23 |
|---|---|---|---|---|
| 8,300,474 B2 | | 10/2012 | Fujita | |
| 8,630,118 B2 | | 1/2014 | Sakai et al. | |
| RE46,014 E | | 5/2016 | Sakai et al. | |
| 2002/0139999 A1 | * | 10/2002 | Hirano | ................. G11C 16/16 257/200 |
| 2019/0180832 A1 | * | 6/2019 | Rori | ................. G11C 16/3477 |

FOREIGN PATENT DOCUMENTS

JP 2013020684 A 1/2013

* cited by examiner

*Primary Examiner* — Mohammed A Bashar
(74) *Attorney, Agent, or Firm* — Holtz, Holtz & Volek PC

(57) ABSTRACT

A semiconductor storage device of an embodiment includes a memory block, a resistance measurement circuit, and a control circuit. The memory block includes first to third control signal lines connected to gates of a first select gate transistor, a plurality of memory cell transistors, and a second select gate transistor. The resistance measurement circuit measures resistance of at least one control signal line among the first to third control signal lines. The control circuit performs erase, program, and read of data at the plurality of memory cell transistors included in the memory block. The control circuit determines, based on a measurement result of the resistance measurement by the resistance measurement circuit, whether to set a fail status to a result of erase verify that verifies the erase.

13 Claims, 10 Drawing Sheets

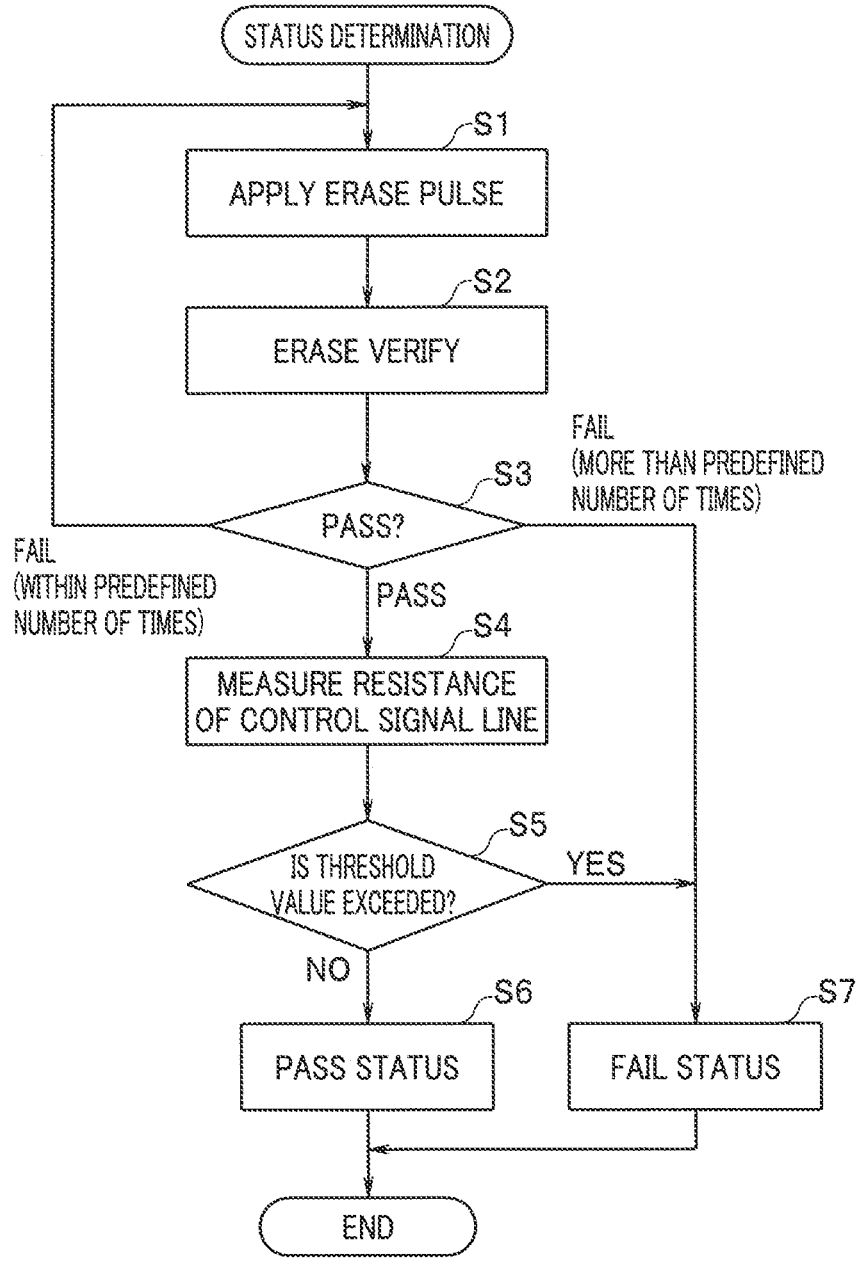

SEMICONDUCTOR STORAGE DEVICE AND ERASE VERIFICATION METHOD

CROSS-REFERENCE TO RELATED APPLICATION

This application is based upon and claims the benefit of priority from the prior Japanese Patent Application No. 2021-144217 filed in Japan on Sep. 3, 2021, the entire contents of which are incorporated herein by reference.

FIELD

Embodiments of the present invention relate to a semiconductor storage device and an erase verification method.

BACKGROUND

Recently, a three-dimensional structure has been employed in a semiconductor storage device, such as a NAND memory, in accordance with miniaturization and large-capacity requests. In a semiconductor storage device of such a kind, a memory cell transistor is not only configured as a single level cell (SLC) that can store data of one bit (two values) but is also configured as a multi-level cell (MLC) that can store data of two bits (four values), a triple level cell (TLC) that can store data of three bits (eight values), or a quad level cell (QLC) that can store data of four bits (16 values) in some cases.

In such a semiconductor storage device, defective read potentially occurs due to high resistance of a word line or the like, which has been a problem.

BRIEF DESCRIPTION OF THE DRAWINGS

FIG. 11 is a flowchart for determining a status of erase verify.

DETAILED DESCRIPTION

Figure 1:
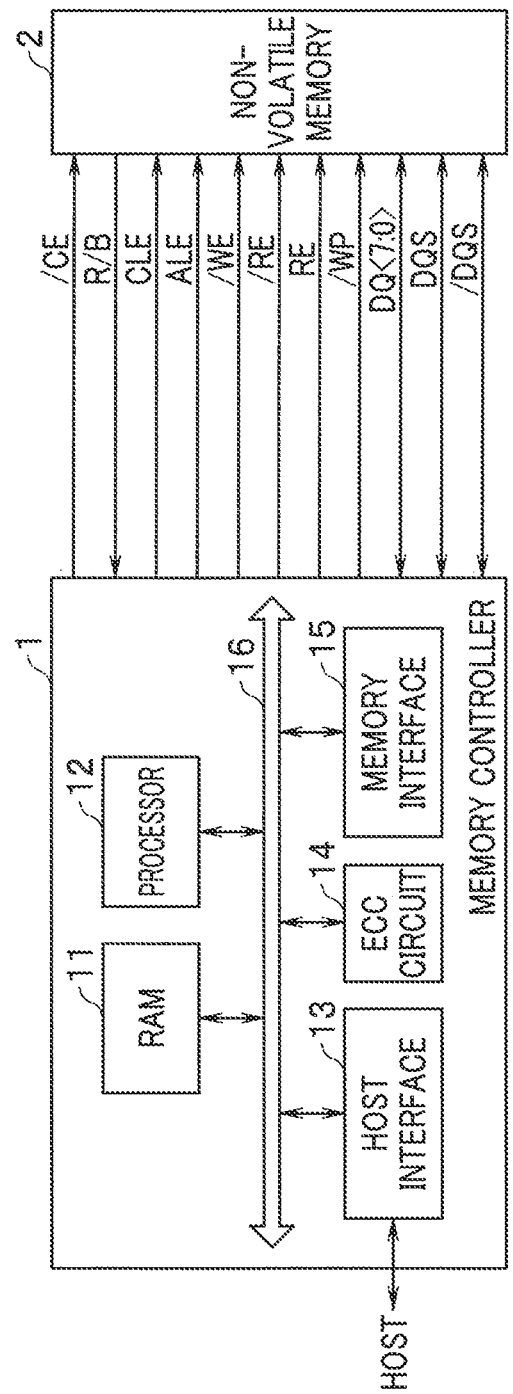
FIG. 1 is a block diagram illustrating an exemplary configuration of a memory system according to an embodiment.

A semiconductor storage device of an embodiment includes a memory block, a resistance measurement circuit, and a control circuit. The memory block includes a plurality of memory strings, a first control signal line, a plurality of second control signal lines, a third control signal line, and a plurality of bit lines, the plurality of memory strings each including a first select gate transistor, a plurality of memory cell transistors, and a second select gate transistor that are connected in series, the first control signal line being connected to a gate of the first select gate transistor of each of the plurality of memory strings in common, the plurality of second control signal lines each being connected to gates of the memory cell transistors of the plurality of memory strings on a corresponding row in common, the third control signal line being connected to a gate of the second select gate transistor of each of the plurality of memory strings in common, the plurality of bit lines being connected to the plurality of memory strings. The resistance measurement circuit measures resistance of at least one control signal line among the first control signal line, the second control signal lines, and the third control signal line. The control circuit performs erase, program, and read of data at the plurality of memory cell transistors included in the memory block. The control circuit determines, based on a measurement result of the resistance measurement by the resistance measurement circuit, whether to set a fail status to a result of erase verify that verifies the erase.

Embodiments of the present invention will be described below in detail with reference to the accompanying drawings.

First Embodiment

The present embodiment prevents occurrence of defective read by determining an erase status based on resistance of a control signal line such as a word line. When new data is to be written in a semiconductor storage device, data in a block is erased through erase operation, and then desired data is written to a memory cell through program operation. In the erase operation, verification (erase verify) of whether erase is normally performed is performed. In the program operation, verification (program verify) of whether program is normally performed is performed. These verify results are each obtained as a pass status indicating success or a fail status indicating failure.

Resistance of a control signal line such as a word line becomes high due to a contact defect or the like in some cases. For example, a contact defect is likely to occur to a source-side select gate line on which a contact is formed at an end part of a substrate. However, even when such a contact defect occurs, a source-side select gate potentially becomes on to some extent due to influence of coupling and the pass status is obtained in erase verify and program verify in some cases. In this case, reading data potentially suffers uncorrectable error at reading in which voltage applied to a word line is finely controlled.

Thus, in the present embodiment, occurrence of uncorrectable error at reading is prevented by detecting resistance of a control signal line and determining a status after erase operation.

(Configuration of Memory System)

FIG. 1 is a block diagram illustrating an exemplary configuration of a memory system according to the embodiment. The memory system of the present embodiment includes a memory controller 1 and a non-volatile memory 2. The memory system is connectable to a host. The host is an electronic device such as a personal computer or a portable terminal.

The non-volatile memory 2 is a semiconductor storage device configured to store data in a non-volatile manner and is, for example, a NAND memory. In the present embodiment, the non-volatile memory 2 is a NAND memory including a memory cell transistor capable of storing three bits, in other words, a 3 bit/Cell (triple level cell (TLC)) NAND memory, but is not limited to such a memory. The non-volatile memory 2 has a three-dimensional structure.

The memory controller 1 and the non-volatile memory 2 are connected to each other through a NAND bus. The memory controller 1 controls data writing to the non-volatile memory 2 in accordance with a writing request from the host. The memory controller 1 controls data reading from the non-volatile memory 2 in accordance with a reading request from the host. The memory controller 1 includes a random access memory (RAM) 11, a processor 12, a host interface 13, an error-check-and-correct (ECC) circuit 14, and a memory interface 15. The RAM 11, the processor 12, the host interface 13, the ECC circuit 14, and the memory interface 15 are connected to one another through an internal bus 16.

The host interface 13 outputs a request, writing data, and the like received from the host to the internal bus 16. In addition, the host interface 13 transmits data read from the non-volatile memory 2, a response from the processor 12, and the like to the host.

The memory interface 15 controls, based on instructions from the processor 12, processing that writes data or the like to the non-volatile memory 2 and processing that reads data or the like from the non-volatile memory 2.

The processor 12 collectively controls the memory controller 1. The processor 12 is, for example, a central processing unit (CPU) or a micro processing unit (MPU). When the processor 12 has received a request from the host through the host interface 13, the processor 12 performs control in accordance with the request. For example, the processor 12 instructs, in accordance with a request from the host, the memory interface 15 to perform data and parity writing to the non-volatile memory 2. In addition, the processor 12 instructs, in accordance with a request from the host, the memory interface 15 to perform data and parity reading from the non-volatile memory 2.

The processor 12 determines, for data accumulated in the RAM 11, a storage region (hereinafter referred to as a memory region) on the non-volatile memory 2. Data is stored in the RAM 11 through the internal bus 16. The processor 12 performs the memory region determination for data in a page unit as a writing unit, in other words, page data. In the present specification, data stored in one page of the non-volatile memory 2 is defined as unit data. The unit data is encoded and stored as, for example, a code word in the non-volatile memory 2.

Note that encoding is not essential. The memory controller 1 may store unit data in the non-volatile memory 2 without encoding, but encoding is performed in the exemplary configuration illustrated in FIG. 1. When the memory controller 1 does not perform encoding, page data is identical to unit data. One code word may be generated based on one piece of unit data or based on divided data into which the unit data is divided. Alternatively, one code word may be generated by using a plurality of pieces of unit data.

The processor 12 determines a memory region at a writing destination on the non-volatile memory 2 for each unit data. A physical address is allocated to each memory region on the non-volatile memory 2. The processor 12 manages each memory region at a writing destination of unit data by using the physical address. The processor 12 designates the physical address of a determined memory region and instructs the memory interface 15 to write data to the non-volatile memory 2. The processor 12 manages correspondence between a logical address (logical address managed by the host) and a physical address of data. When the processor 12 has received a reading request including a logical address from the host, the processor 12 specifies a physical address corresponding to the logical address, designates the physical address, and instructs the memory interface 15 to perform data reading.

The ECC circuit 14 generates a code word by encoding data stored in the RAM 11. In addition, the ECC circuit 14 decodes a code word read from the non-volatile memory 2.

The RAM 11 temporarily stores data received from the host until the data is stored in the non-volatile memory 2, and temporarily stores data read from the non-volatile memory 2 until the data is transmitted to the host. The RAM 11 is a general-purpose memory such as a static random access memory (SRAM) or a dynamic random access memory (DRAM).

In the exemplary configuration illustrated in FIG. 1, the memory controller 1 includes the ECC circuit 14 and the memory interface 15. However, the ECC circuit 14 may be built in the memory interface 15. Alternatively, the ECC circuit 14 may be built in the non-volatile memory 2.

When the memory controller 1 has received a writing request from the host, the memory controller 1 operates as follows. The processor 12 temporarily stores writing data in the RAM 11. The processor 12 reads the data stored in the RAM 11 and inputs the data to the ECC circuit 14. The ECC circuit 14 encodes the input data and provides a code word to the memory interface 15. The memory interface 15 writes the input code word to the non-volatile memory 2.

When the memory controller 1 has received a reading request from the host, the memory controller 1 operates as follows. The memory interface 15 provides a code word read from the non-volatile memory 2 to the ECC circuit 14. The ECC circuit 14 decodes the input code word and stores the decoded data in the RAM 11. The processor 12 transmits the data stored in the RAM 11 to the host through the host interface 13.

(Configuration of Non-Volatile Memory)

Figure 2:
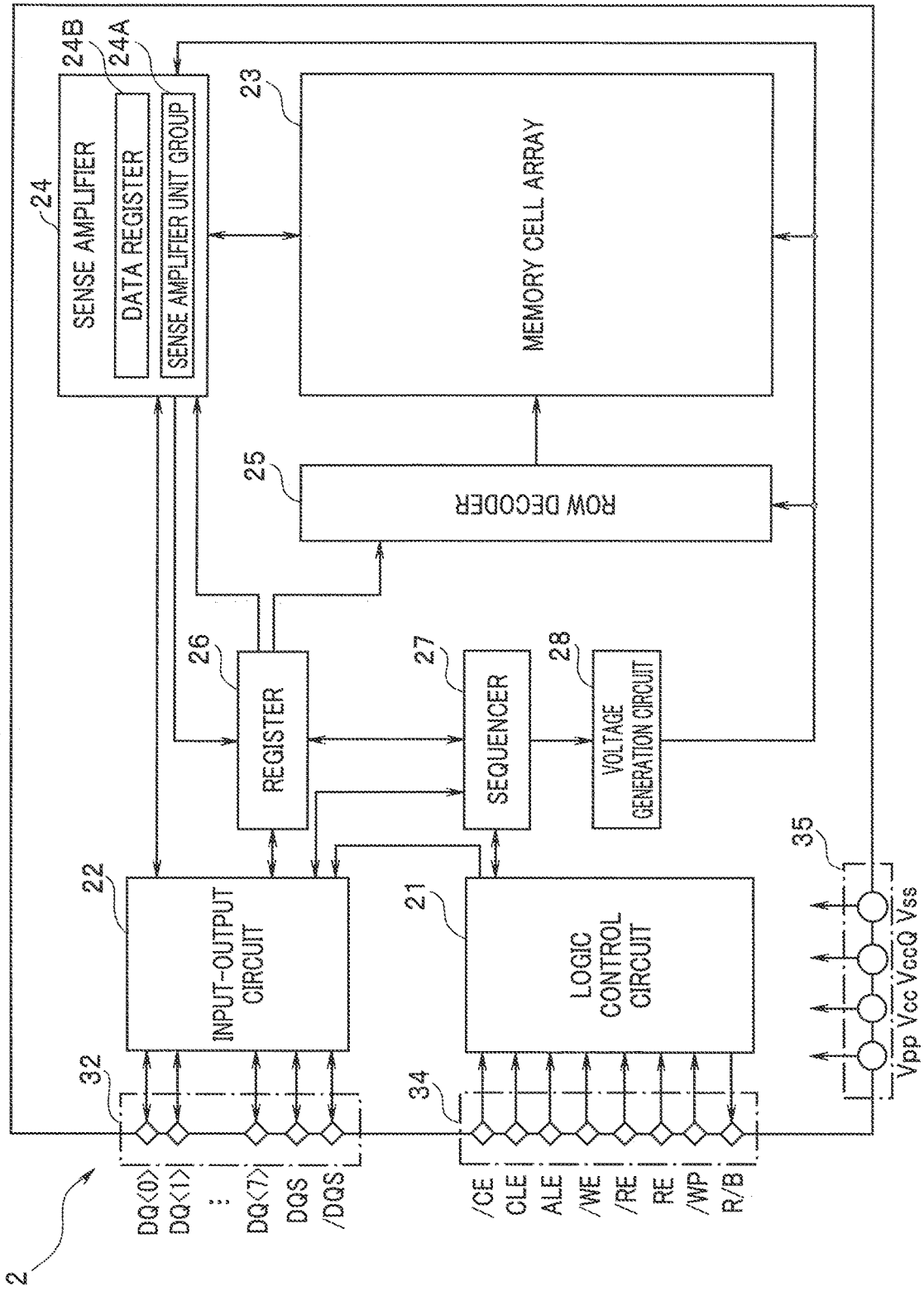
FIG. 2 is a block diagram illustrating an exemplary configuration of a non-volatile memory of the present embodiment.

FIG. 2 is a block diagram illustrating an exemplary configuration of the non-volatile memory of the present embodiment. The non-volatile memory 2 includes a logic control circuit 21, an input-output circuit 22, a memory cell army 23, a sense amplifier 24, a row decoder 25, a register 26, a sequencer 27, a voltage generation circuit 28, an input-output pad group 32, a logic control pad group 34, and a power source input terminal group 35.

The memory cell array 23 includes a plurality of blocks (memory blocks). These blocks BLK each include a plurality of memory cell transistors (memory cells). A plurality of bit lines, a plurality of word lines, a source line, and the like are disposed in the memory cell array 23 to control voltage applied to the memory cell transistors. A specific configuration of each block BLK will be described later.

The input-output pad group 32 includes a plurality of terminals (pads) corresponding to signals DQ <7:0> and data strobe signals DQS and /DQS to transmit and receive signals including data to and from the memory controller 1.

The logic control pad group 34 includes a plurality of terminals (pads) corresponding to a chip enable signal /CE, a command latch enable signal CLE, an address latch enable signal ALE, a write enable signal /WE, read enable signals RE and /RE, and a write protect signal /WP to transmit and receive signals to and from the memory controller 1. A symbol "/" added to a signal name indicates active low.

The signal/CE enables selection of the non-volatile memory 2. The signal CLE enables latch of a command transmitted as a signal DQ at a command register. The signal ALE enables latch of an address transmitted as a signal DQ at an address register. The signal/WE enables writing. The signal RE enables reading. The signal/WP prohibits writing and erasure. A signal R/B indicates whether the non-volatile memory 2 is in a ready state (state in which a command from outside can be received) or a busy state (state in which a command from outside cannot be received). The memory controller 1 can know a state of the non-volatile memory 2 by receiving the signal R/B.

The power source input terminal group 35 includes a plurality of terminals through which power voltage Vcc, VccQ, and Vpp and ground voltage Vss are input for supplying various kinds of operation power from outside to the non-volatile memory 2. The power voltage Vcc is circuit power voltage typically provided as operation power from outside and input as, for example, voltage of 3.3 V approximately. The power voltage VccQ is input as, for example, voltage of 1.2 V. The power voltage VccQ is used to transmit and receive signals between the memory controller 1 and the non-volatile memory 2. The power voltage Vpp is power voltage higher than the power voltage Vcc and input as, for example, voltage of 12 V.

The logic control circuit 21 and the input-output circuit 22 are connected to the memory controller 1 through the NAND bus. The input-output circuit 22 transmits and receives signals DQ (for example, DQ0 to DQ7) to and from the memory controller 1 through the NAND bus.

The logic control circuit 21 receives extremal control signals (for example, the chip enable signal/CE, the command latch enable signal CLE, the address latch enable signal ALE, the writing enable signal/WE, the reading enable signals RE and /RE, and the write protect signal/WP) from the memory controller 1 through the NAND bus. The logic control circuit 21 transmits the ready-busy signal R/B to the memory controller 1 through the NAND bus.

The register 26 includes a command register, an address register, and a status register. The command register temporarily stores a command. The address register temporarily stores an address. The status register temporarily stores data necessary for operation of the non-volatile memory 2. The register 26 is composed of, for example, an SRAM.

The sequencer 27 as a control circuit receives a command from the register 26 and controls the non-volatile memory 2 in accordance with a sequence based on the command.

The voltage generation circuit 28 receives power voltage from outside of the non-volatile memory 2 and generates a plurality of kinds of voltage necessary for writing operation, reading operation, and erasure operation by using the power voltage. The voltage generation circuit 28 supplies the generated voltage to the memory cell array 23, the sense amplifier 24, the row decoder 25, and the like.

The row decoder 25 receives a row address from the register 26 and decodes the row address. The row decoder 25 performs selection operation of a word line based on the decoded row address. Then, the row decoder 25 forwards a plurality of kinds of voltage necessary for writing operation, reading operation, and erasure operation to a selected block.

The sense amplifier 24 receives a column address from the register 26 and decodes the column address. The sense amplifier 24 selects a bit line based on the decoded column address. At data reading, the sense amplifier 24 senses and amplifies data read from a memory cell transistor onto the bit line. At data writing, the sense amplifier 24 forwards writing data to the bit line.

The sense amplifier 24 includes a sense amplifier unit group 24A and a data register 24B. At data reading, the data register 24B temporarily stores data detected by the sense amplifier 24 and serially forwards the data to the input-output circuit 22. At data writing, the data register 24B temporarily stores data serially forwarded from the input-output circuit 22 and forwards the data to the sense amplifier 24. The data register 24B is composed of, for example, an SRAM.

(Block Configuration of Memory Cell Array)

Figure 3:
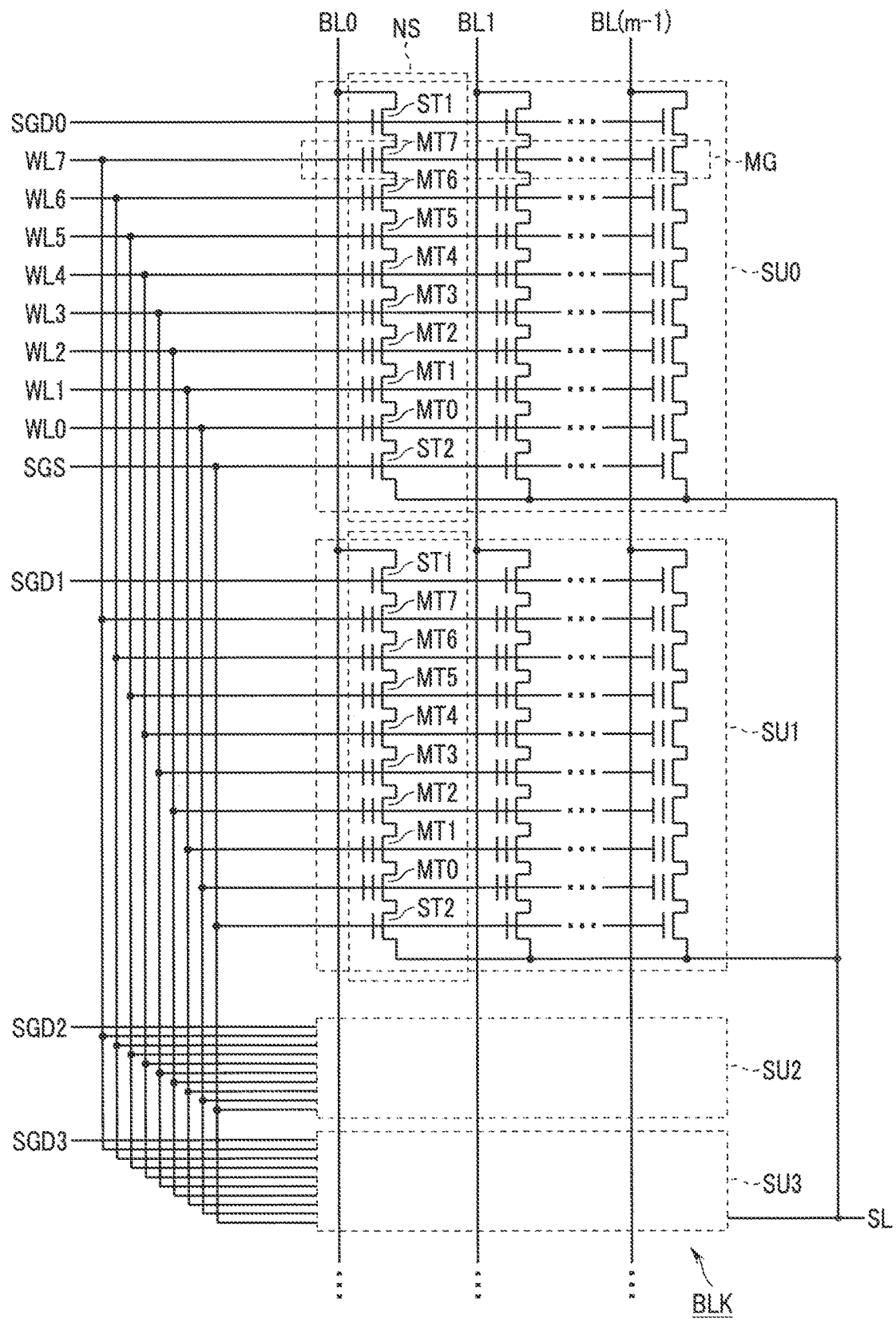
FIG. 3 is a diagram illustrating an exemplary configuration of a block of a NAND memory cell array 23 having a three-dimensional structure.

FIG. 3 is a diagram illustrating an exemplary configuration of a block of the NAND memory cell array 23 having a three-dimensional structure. FIG. 3 illustrates one block BLK among a plurality of blocks included in the memory cell array 23. Any other block of the memory cell array has a configuration same as the configuration in FIG. 3. Note that the present embodiment is also applicable to a memory cell array having a two-dimensional structure.

As illustrated, the block BLK includes, for example, four string units (SU0 to SU3). Each string unit SU includes a plurality of NAND strings NS. In this example, each NAND string NS as a memory string includes eight memory cell transistors MT (MT0 to MT7) and select gate transistors ST1 and ST2. Note that the number of memory cell transistors MT included in each NAND string NS is eight in this example but is not limited to eight and may be, for example, 32, 48, 64, or 96. Each of the select gate transistors ST1 and ST2 is indicated as one transistor on the electric circuit and may have the same structure as the memory cell transistor. A plurality of select gate transistors may be used as each of the select gate transistors ST1 and ST2 to, for example, increase a cutoff characteristic. In addition, a dummy cell transistor may be provided between a memory cell transistor MT and each of the select gate transistors ST1 and ST2.

The memory cell transistors MT are disposed and connected in series between the select gate transistors ST1 and ST2. The memory cell transistor MT7 on one end side is connected to the select gate transistor ST1, and the memory cell transistor MT0 on the other end side is connected to the select gate transistor ST2.

Gates of the select gate transistors ST1 of the string units SU0 to SU3 are connected to select gate lines SGD0 to SGD3, respectively. Gates of the select gate transistors ST2 of the plurality of string units SU in the same block BLK are connected in common to a select gate line SGS. The gates of the memory cell transistors MT0 to MT7 in the same block BLK are connected in common to word lines WL0 to WL7, respectively. In other words, the word lines WL0 to WL7 and the select gate line SGS are each connected in common to the plurality of string units SU0 to SU3 in the same block BLK, but each select gate line SGD is independently connected to a corresponding one of the string units SU0 to SU3 in the same block BLK.

The gates of the memory cell transistors MT0 to MT7 included in each NAND string NS are connected to the word lines WL0 to WL7, respectively. Gates of memory cell transistors MTi on the same row in the block BLK are connected to the same word line WLi. Note that, in description below, a NAND string NS is simply referred to as a "string" in some cases.

Each NAND string NS is connected to a corresponding bit line. Thus, each memory cell transistor MT is connected to the bit line through the select gate transistors ST1 and ST2 and the other memory cell transistors MT included in the NAND string NS. As described above, data in memory cell transistors MT in the same block BLK is erased all at once. On the other hand, data reading and writing are performed per memory cell group MG (or per page). In the present specification, a memory cell group MG is defined to be a plurality of memory cell transistors MT connected to one word line WLi and belonging to one string unit SU. In the present embodiment, the non-volatile memory 2 is a TLC NAND memory capable of storing data of three bits (eight values). Thus, one memory cell group MG can store data of three pages. Three bits that can be stored in each memory cell transistor MT correspond to three pages.

Note that states of the select gate transistors ST1 and ST2 are controlled by the select gate lines SGD and SGS and states of the memory cell transistors MT0 to MT7 are controlled by the word lines WL0 to WL7, and thus the select gate lines SGD and SGS and the word lines WL0 to WL7 are also referred to as control signal lines.

Figure 4:
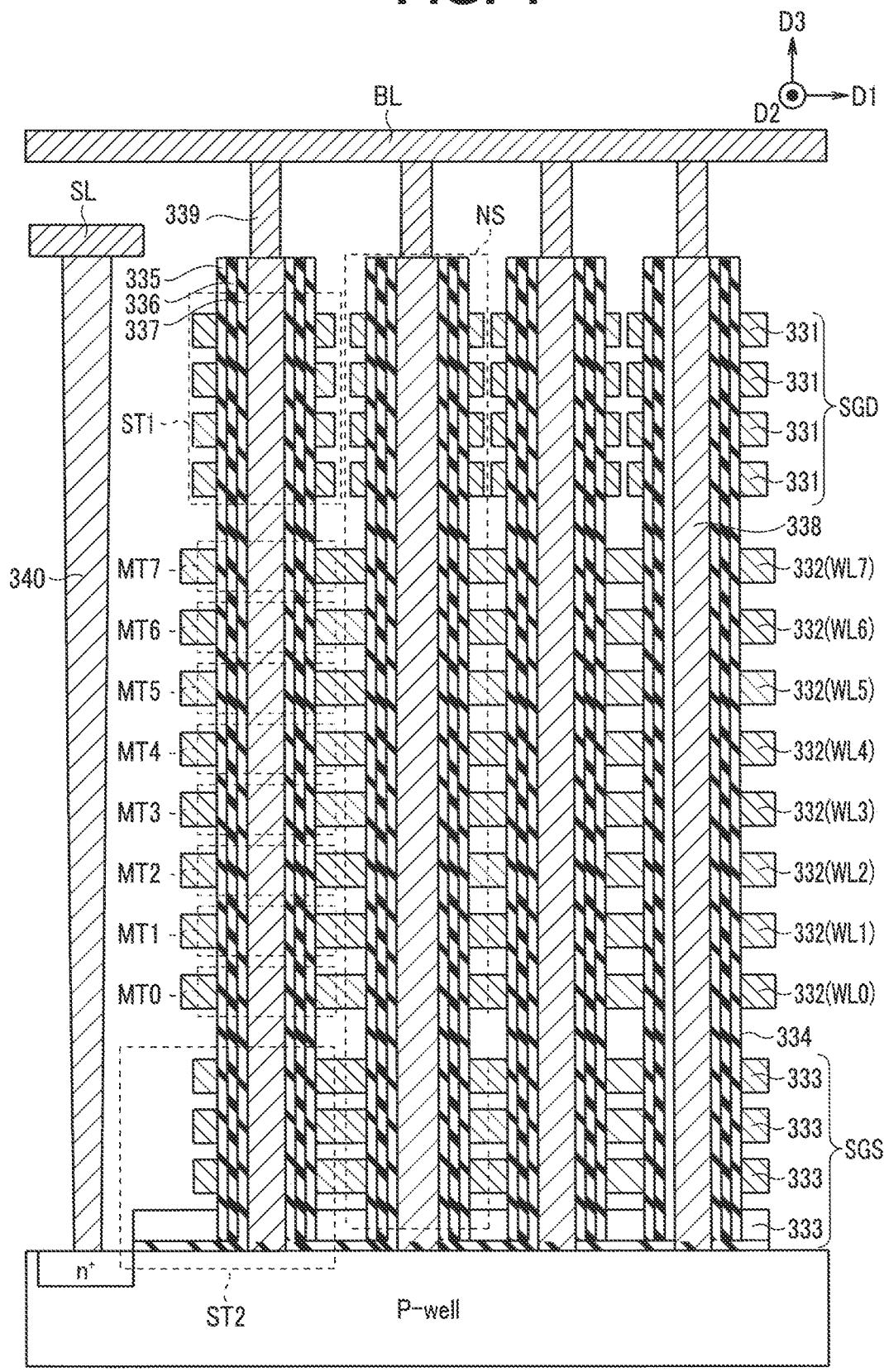
FIG. 4 is a cross-sectional view of a partial region of the NAND memory cell array having a three-dimensional structure.

FIG. 4 is a cross-sectional view of a partial region of the NAND memory cell array having a three-dimensional structure. As illustrated in FIG. 4, a plurality of NAND strings NS are formed in a D1 direction on a p-type well region (P-well). Specifically, a plurality of wiring layers 333 that function as the select gate line SGS, a plurality of wiring layers 332 that function as the word lines WLi, and a plurality of wiring layers 331 that function as the select gate line SGD are stacked on the p-type well region.

A memory hole 334 is formed to penetrate through the wiring layers 333, 332, and 331 to the p-type well region. A block insulation film 335, a charge accumulation film (charge storage region) 336, and a gate insulation film 337 are sequentially formed on a side surface of the memory hole 334, and an electric conductor pier 338 is embedded in the memory hole 334. The electric conductor pier 338 is made of, for example, polysilicon and functions as a region in which a channel is formed during operation of the memory cell transistors MT and the select gate transistors ST1 and ST2 included in a corresponding NAND string NS. Specifically, the wiring layers 331, the electric conductor pier 338, and the films 335 to 337 between the wiring layers 331 and the pier function as the select gate transistor ST1, each wiring layer 332, the electric conductor pier 338, and the films 335 to 337 between the layer and the pier function as a memory cell transistor MT, and the wiring layers 333, each electric conductor pier 338, and the films 335 to 337 between the wiring layers 333 and the pier function as the select gate transistor ST2.

Note that the memory hole 334 and the electric conductor pier 338 are illustrated as a cylinder shape of a constant diameter in FIG. 4, but in reality, have a taper shape of a diameter that decreases toward the p-type well region. Alternatively, depending on a manufacturing process, the memory hole 334 and the electric conductor pier 338 may have a multiple-stage taper shape of a diameter that increases halfway through a taper shape and decreases toward the p-type well region again.

In each NAND string NS, the select gate transistor ST2, the plurality of memory cell transistors MT, and the select gate transistor ST1 are sequentially formed on the p-type well region. A wiring layer that functions as a bit line BL is formed on an upper side (D3 direction) of the electric conductor pier 338. A contact plug 339 that connects the electric conductor pier 338 and the bit line BL is formed at an upper end of the electric conductor pier 338.

In addition, a n+ impurity diffusion layer and a p+ impurity diffusion layer are formed in a surface of the p-type well region. A contact plug 340 is formed on the n+ impurity diffusion layer, and a wiring layer that functions as a source line SL is formed on the contact plug 340.

A plurality of above-described configurations illustrated in FIG. 4 are arrayed in a depth direction (D2 direction) of the sheet of FIG. 4, and a set of a plurality of NAND strings linearly arranged in the depth direction form one string unit SU.

(Sense Amplifier)

Figure 5:
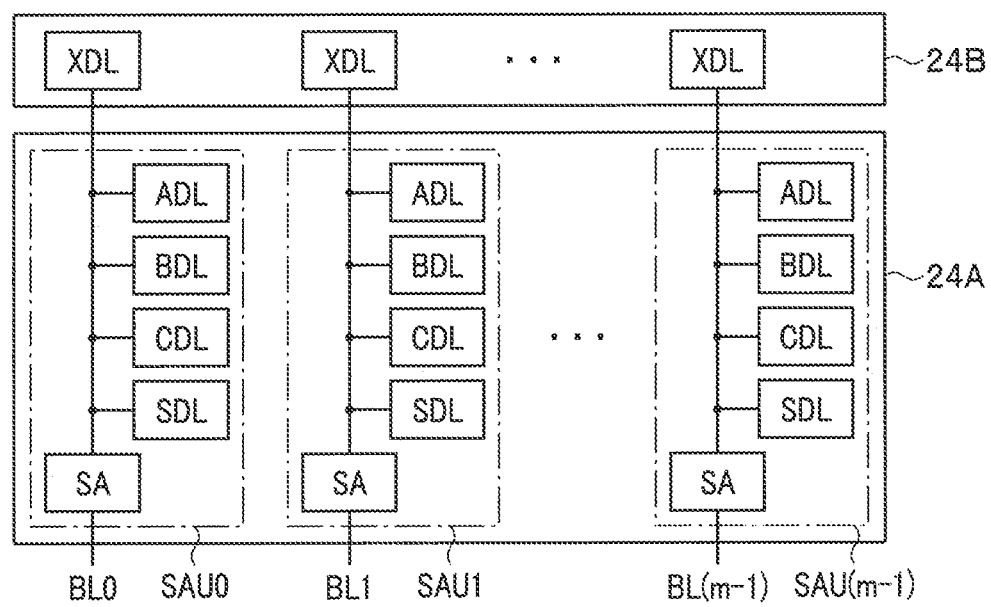
FIG. 5 is a block diagram illustrating an example of a sense amplifier 24 in FIG. 2.

FIG. 5 is a block diagram illustrating an example of the sense amplifier 24 in FIG. 2.

The sense amplifier 24 includes the sense amplifier unit group 24A and the data register 24B. The sense amplifier unit group 24A includes sense amplifier units SAU0 to SAU(m−1) corresponding to bit lines BL0 to BL(m−1). Each sense amplifier unit SAU includes a sense amplifier section SA and data latch circuits SDL, ADL, BDL, and CDL. The sense amplifier section SA and the data latch circuits SDL, ADL, BDL, and CDL are connected so that data can be forwarded to one another.

The data latch circuits SDL, ADL, BDL, and CDL temporarily store data. In writing operation, the sense amplifier section SA controls voltage of the bit line BL in accordance with data stored in the data latch circuit SDL. The data latch circuits ADL, BDL, and CDL are used for multiple-value operation in which the memory cell transistors MT store data of two bits or more. Specifically, the data latch circuit ADL is used to store a lower-level page. The data latch circuit BDL is used to store an intermediate-level page. The data latch circuit CDL is used to store a higher-level page. The number of data latch circuits included in each sense amplifier unit SAU is optionally changeable in accordance with the number of bits stored in one memory cell transistor MT.

In reading operation, the sense amplifier section SA senses data read onto the corresponding bit line BL and determines whether the data is "0" data or "1" data. In writing operation, the sense amplifier section SA applies voltage to the bit line BL based on writing data.

The data register 24B includes data latch circuits XDL in a number corresponding to the sense amplifier units SAU0 to SAU(m−1). Each data latch circuit XDL is connected to the input-output circuit 22. Each data latch circuit XDL is a circuit used for data forwarding between the sense amplifier 24 and outside and temporarily stores writing data transferred from the input-output circuit 22 and reading data transferred from the corresponding sense amplifier unit SAU. More specifically, data forwarding between the input-output circuit 22 and each of the sense amplifier units SAU0 to SAU(m−1) is performed through the corresponding data latch circuit XDL of one page. Writing data received by the input-output circuit 22 is forwarded to any of the data latch circuits ADL, BDL, and CDL through the corresponding data latch circuit XDL. Reading data read by the sense amplifier section SA is forwarded to the input-output circuit 22 through the corresponding data latch circuit XDL.

(Row Decoder)

Figure 6:
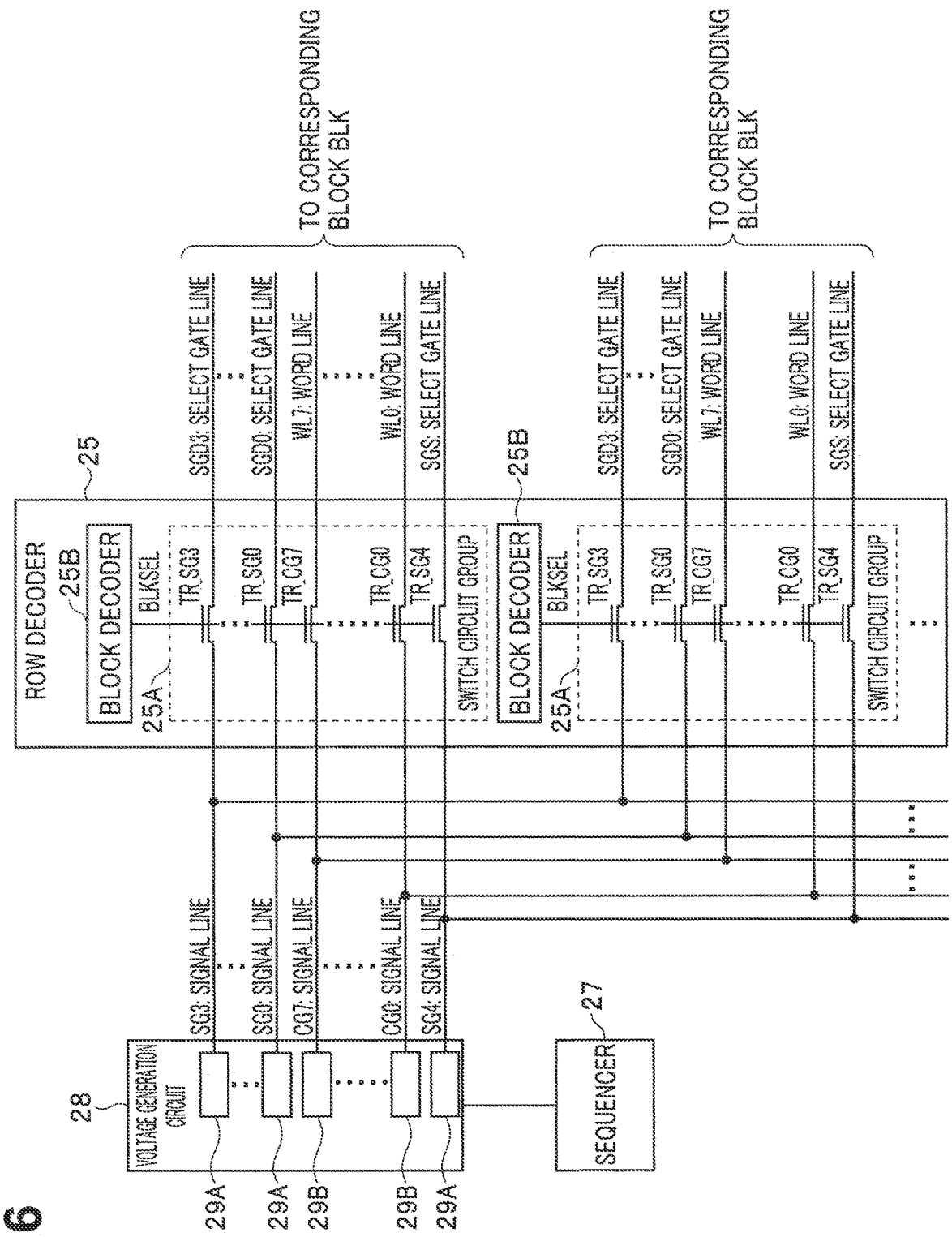
FIG. 6 is a block diagram illustrating an example of a row decoder 25 in FIG. 2.

FIG. 6 is a block diagram illustrating an example of the row decoder 25 in FIG. 2.

The voltage generation circuit 28 includes a plurality of SG drivers (select gate line drivers) 29A configured to supply voltage to signal lines SG0 to SG4, and a plurality of CG drivers (word line drivers) 29B configured to supply voltage to signal lines CG0 to CG7. Hereinafter, the SG drivers 29A and the CG drivers 29B are referred to as drivers 29 when not to be distinguished. The control signal lines SG0 to SG4 and CG0 to CG7 are branched through the row decoder 25 and connected to wires of each block BLK. Specifically, the signal lines SG0 to SG3 function as global drain-side select gate lines and are connected to the select gate lines SGD0 to SGD3 as local select gate lines in each block BLK through the row decoder 25. The signal lines CG0 to CG7 function as global word lines and are connected to the word lines WL0 to WL7 as local word lines in each block BLK through the row decoder 25. The signal line SG4 functions as a global source-side select gate line and is connected to the select gate line SGS as a local select gate line in each block BLK through the row decoder 25.

In other words, the signal lines SG0 to SG4 and CG0 to CG7 function as the select gate lines SGD0 to SGD3 and the word lines WL0 to WL7, which are control signal lines, and are used to control the states of the select gate transistors ST1 and ST2 and the memory cell transistors MT. Thus, the signal lines SG0 to SG4 and CG0 to CG7 are also referred to as global control signal lines below.

The voltage generation circuit 28 generates various kinds of voltage under control of the sequencer 27. The SG drivers 29A and the CG drivers 29B supply the various kinds of generated voltage to the corresponding signal lines SG0 to SG4 and signal lines CG0 to CG7. For example, each CG driver 29B selectively supplies voltage such as voltage VCGRV, voltage VREAD, or voltage VCG_ER to the corresponding word line WL in accordance with an operation target (row address) in reading operation.

The row decoder 25 includes a plurality of switch circuit groups 25A corresponding to respective blocks, and a plurality of block decoders 25B provided for the plurality of switch circuit groups 25A. Each switch circuit group 25A includes a plurality of transistors TR_SG0 to TR_SG3 connecting the signal lines SG0 to SG3 and the select gate lines SGD0 to SGD3, respectively, a plurality of transistors TR_CG0 to TR_CG7 connecting the signal lines CG0 to CG7 and the word lines WL0 to WL7, respectively, and a transistor TR_SG4 connecting the signal line SG4 and the select gate line SGS. The transistors TR_SG0 to TR_SG4 and the transistors TR_CG0 to TR_CG7 are each a high-withstand-voltage transistor.

When designated by a row address, each block decoder 25B supplies a block select signal BLKSEL to gates of the transistors TR_SG0 to TR_SG4 and the transistors TR_CG0 to TR_CG7. Accordingly, in a switch circuit group 25A to which the block select signal BLKSEL is supplied from the block decoder 25B designated by the row address, the transistors TR_SG0 to TR_SG4 and the transistors TR_CG0 to TR_CG7 become "on" states and conduct electricity, and thus voltage supplied from the voltage generation circuit 28 to the signal lines SG0 to SG4 and the signal lines CG0 to CG7 is supplied to the select gate lines SGD0 to SGD3 and SGS and the word lines WL0 to WL7 included in a block BLK as an operation target.

In other words, various kinds of voltage necessary for operation is supplied to each word line WL by the voltage generation circuit 28 and the row decoder 25. For example, voltage VSGD is supplied to a select gate line SGD (SGD-sel) connected to a select gate transistor ST1 belonging to a string unit SU as an operation target, voltage Vss is supplied to a select gate line SGD (SGDusel) connected to a select gate transistor ST1 not belonging to the string unit SU as the operation target, and voltage VSGS is supplied to the select gate line SGS connected in common to the select gate transistors ST2 in each block BLK.

(Program Operation)

When multiple-value data is to be written to a memory cell transistor MT, threshold voltage of the memory cell transistor MT is set to a value in accordance with a value of the data. When program voltage VPGM and bit line voltage VBL are applied to the memory cell transistor MT, electrons are injected into the charge accumulation film 336 and the threshold voltage increases. The threshold voltage of the memory cell transistor MT can be increased by increasing the program voltage VPGM to increase an amount of injected electrons. However, due to variance among memory cell transistors MT, the amount of injected electrons is different for each memory cell transistor MT even when the same program voltage VPGM is applied. Electrons injected once are held until erasure operation is performed. Thus, program operation and verify operation (loop) are performed a plurality of times along with gradual increase of the program voltage VPGM so as not to exceed a range (hereinafter referred to as a target region) of a threshold voltage that can be allowed as a threshold voltage to be set to each memory cell transistor MT.

The verify operation that determines whether or not the threshold voltage of the memory cell transistor has reached the target region is performed by reading data after the program operation. The threshold voltage of the memory cell transistor is increased to the target region by repeating the above-described combination of the program operation and the verify operation. Writing to the memory cell transistor, the threshold voltage of which is determined to have reached the target region, in other words, have exceeded a target level as a lowest value of the target region by the verify operation is prohibited thereafter.

(Reading Operation)

Data reading from a multiple-value memory cell transistor is performed as the row decoder 25 applies reading voltage to a word line (hereinafter referred to as a select word line) WL connected to a memory cell transistor MT as a reading target and the sense amplifier 24 senses data read onto the corresponding bit line BL to determine whether the read data is "0" or "1". Note that, for conduction of a memory cell transistor connected to any word line (hereinafter referred to as a non-select word line) WL other than the select word line, the row decoder 25 provides, to the non-select word line WL, sufficiently high voltage VREAD necessary for turning on each memory cell transistor.

In reading operation, the sense amplifier 24 fixes a bit line BL to constant voltage (for example, 0.5 V) and charges a non-illustrated sense node SEN inside the corresponding sense amplifier section SA to predetermined precharge voltage Vpre higher than the voltage of the bit line BL. In this state, the sense amplifier 24 electrically connects the sense node SEN to the bit line BL. Accordingly, current flows from the sense node SEN to the bit line BL and voltage of the sense node SEN gradually decreases.

The voltage of the sense node SEN changes in accordance with a state of the threshold voltage of each memory cell transistor connected to the corresponding bit line BL. Specifically, when the threshold voltage of the memory cell transistor is lower than the reading voltage, the memory cell transistor is in an "on" state and large cell current flows to the memory cell transistor, which increases speed at which the voltage of the sense node SEN decreases. When the threshold voltage of the memory cell transistor is higher than the reading voltage, the memory cell transistor is in an "off" state and small or no cell current flows to the memory cell transistor, which decreases the speed at which the voltage of the sense node SEN decreases.

A state of writing to the memory cell transistor is determined by using such difference in the speed of voltage decrease of the sense node SEN, and a result is stored in a data latch circuit. For example, whether the voltage of the sense node SEN is in a low state (hereinafter referred to as "L") or a high state (hereinafter referred to as "H") is determined at a first time point at which a first predetermined duration has elapsed since start of discharging of electric charge at the sense node SEN. For example, when the threshold voltage of the memory cell transistor is lower than the reading voltage, the memory cell transistor is in a "completely on" state and large cell current flows to the memory cell transistor. Accordingly, the voltage of the sense node SEN rapidly decreases with a relatively large amount of voltage decrease, and the sense node SEN becomes "L" at the first time point.

When the threshold voltage of the memory cell transistor is higher than the reading voltage, the memory cell transistor is in the "off" state and extremely small or no cell current flows to the memory cell transistor. Accordingly, the voltage of the sense node SEN extremely gradually decreases with a relatively small amount of voltage decrease, and the sense node SEN remains at "H" at the first time point.

In this manner, the sense amplifier 24 monitors a state of the sense node SEN with the reading voltage being applied to the select word line by the row decoder 25, thereby determining whether the threshold voltage of the memory cell transistor is higher or lower than the reading voltage. Thus, it is possible to determine a state of each memory cell transistor by applying voltage between states as the reading voltage to the select word line WL and read data allocated to each state.

(Erase Verify)

At erase, a predetermined high voltage pulse (hereinafter referred to as an erase pulse) is applied to the source line SL. Accordingly, electric charge accumulated in the charge accumulation film 336 of each memory cell transistor MT of each NAND string NS is discharged to set the threshold voltage of the memory cell transistor MT back to an Er state (erase state).

Erase verify is performed to check whether each memory cell transistor MT has become the Er state. The erase verify is performed by applying the erase verify voltage VCG_ER higher than the Er state to the gate of each memory cell transistor MT. The voltage VSGS for turning on a select gate transistor ST2 is applied to the gate of each select gate transistor ST2. The turn-on voltage VSGD is applied only to the gate of the select gate transistor ST1 included in a NAND string as a verify target, and the turn-off voltage VSS is applied to the gates of the other select gate transistors ST1. In other words, the erase verify is performed for each NAND string NS.

The sense amplifier 24 fixes a bit line BL to constant voltage (for example, 0.5 V) and charges a non-illustrated sense node SEN inside the corresponding sense amplifier section SA to predetermined precharge voltage Vpre higher than the voltage of the bit line BL. In this state, the sense amplifier 24 connects the sense node SEN to the bit line BL. Accordingly, current flows from the sense node SEN to the bit line BL and the voltage of the sense node SEN gradually decreases.

In a case where the threshold voltage of each memory cell transistor MT of a NAND string NS as an erase verify target is at the Er state, each memory cell transistor MT becomes the "on" state when the erase verify voltage VCG_ER is applied to the gate of the memory cell transistor MT and large cell current flows to the memory cell transistor MT, which increases speed at which the voltage of the sense node SEN decreases.

When the threshold voltage of any memory cell transistor MT has not returned to the Er state, the memory cell transistor MT is in the "off" state and small or no current flows to the memory cell transistor MT, in other words, flows to the bit line BL, which decreases the speed at which the voltage of the sense node SEN decreases.

Thus, when the speed of voltage decrease of the sense node SEN is high, it can be determined that erase at the NAND string NS as the erase verify target is successful. When the speed of voltage decrease of the sense node SEN is low, there is a memory cell transistor MT that has not returned to the Er state in the NAND string NS as the erase verify target, and it can be determined that the erase is unsuccessful. In this case, the erase pulse application and the erase verify are repeated to perform the erase. When the erase is successful as a result, the pass status is obtained. When the erase is not successful, for example, even if the erase pulse application and the erase verify are repeated a predetermined number of times, it is determined that the erase has failed and the fail status of the erase is obtained. The pass status and the fail status are stored in a register by the processor 12 and forwarded to the host as necessary.

For example, when high resistance such as a contact defect occurs to the select gate line SGS through which the voltage VSGS for turning on each select gate transistor ST2 is supplied, the erase verify should fail but, in some cases, the select gate transistor ST2 becomes on to some extent due to influence of coupling and passes the erase verify as described above.

Thus, in the present embodiment, when the pass status of erase has occurred, a resistance value of a control signal line is measured and whether to maintain the pass status is determined in accordance with the measured resistance value.

(Resistance Measurement)

Figure 7:
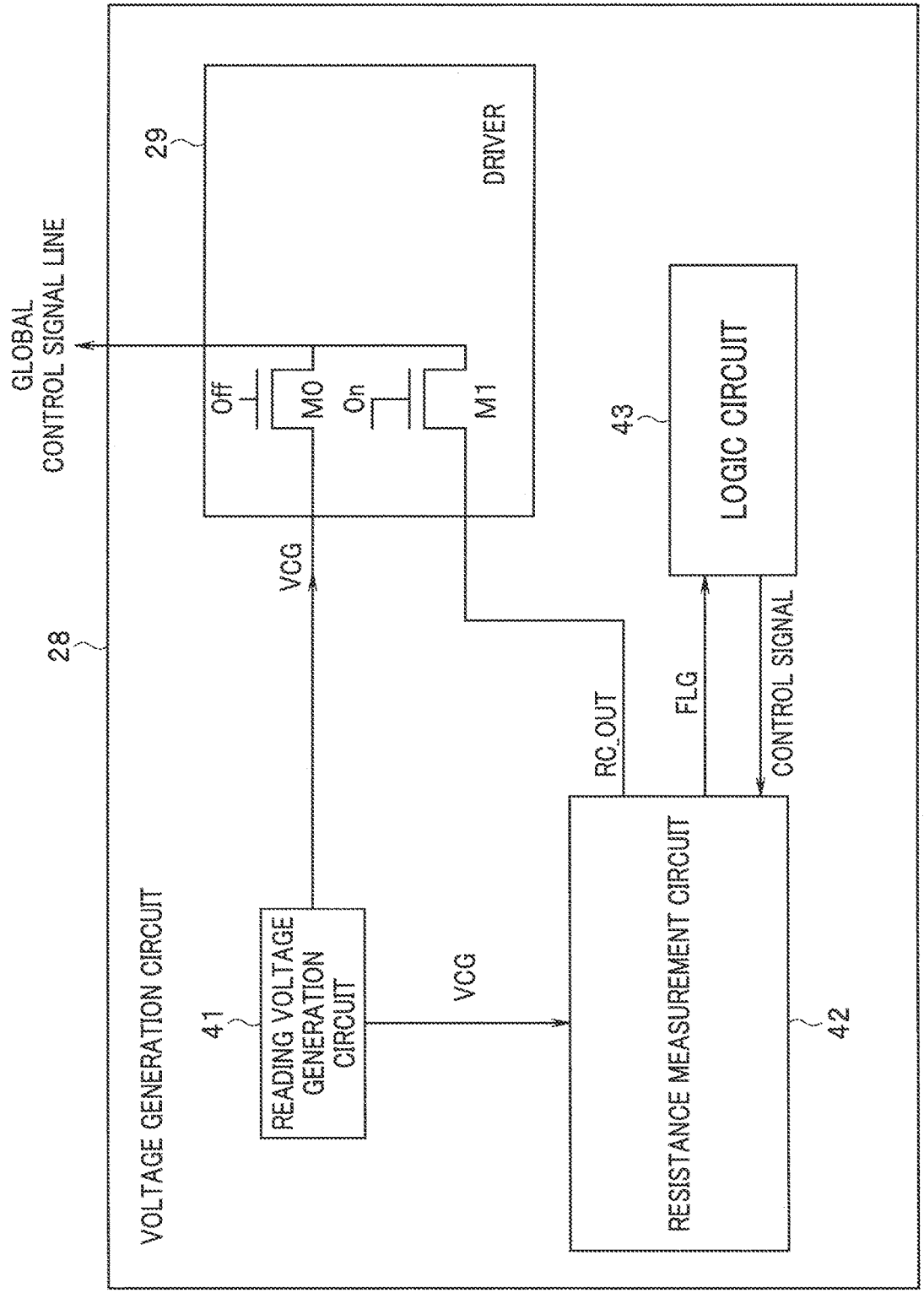
FIG. 7 is a circuit diagram illustrating a configuration of a voltage generation circuit 28 including a resistance measurement circuit configured to measure a resistance value of a control signal line.

FIG. 7 is a circuit diagram illustrating a configuration of the voltage generation circuit 28 including a resistance measurement circuit configured to measure a resistance value of a control signal line. Note that the voltage generation circuit 28 includes voltage generation circuits configured to generate a plurality of kinds of voltage, but only a reading voltage generation circuit 41 among the voltage generation circuits is illustrated in FIG. 7. Moreover, the voltage generation circuit 28 includes a plurality of drivers 29, but only one of the drivers 29 is illustrated in FIG. 7.

The voltage generation circuit 28 includes the reading voltage generation circuit 41, the driver 29, a resistance measurement circuit 42, and a logic circuit 43. The reading voltage generation circuit 41 generates reading voltage VCG. The reading voltage VCG is provided to a switch M0 of the driver 29. As described later, the resistance measurement circuit 42 generates measurement voltage RC_OUT and outputs the measurement voltage RC_OUT to a switch M1 of the driver 29. At reading operation, the driver 29 turns on the switch M0 and turns off the switch M1. At resistance measurement of a control signal line, the driver 29 turns on the switch M1 and turns off the switch M0. In this manner, at resistance measurement of a control signal line, the measurement voltage RC_OUT from the resistance measurement circuit 42 is selected by the switch M1 and transferred to the control signal line through a global control signal line.

Figure 8:
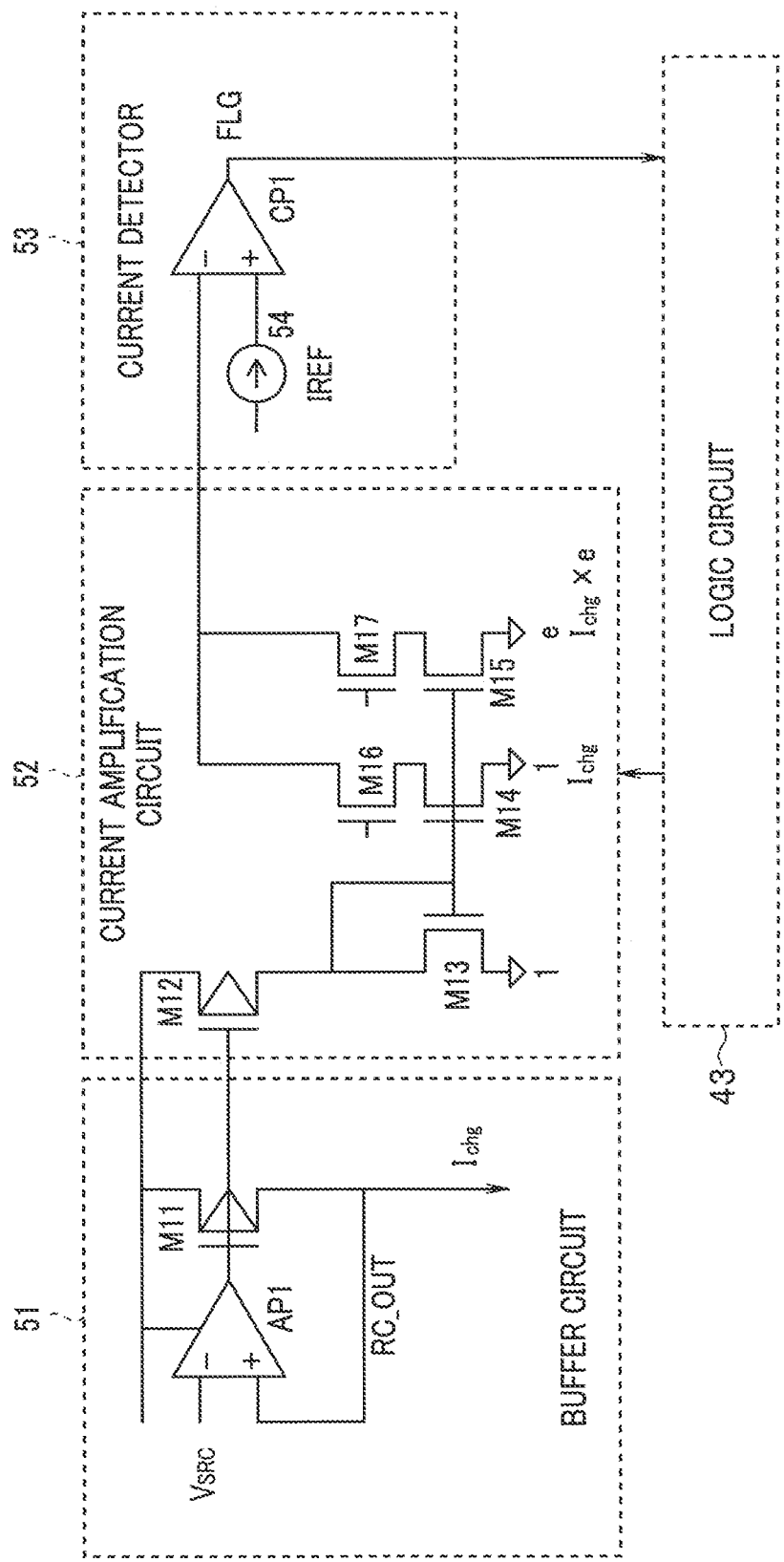
FIG. 8 is a circuit diagram illustrating an example of a specific configuration of a resistance measurement circuit 42 in FIG. 7.

FIG. 8 is a circuit diagram illustrating an example of a specific configuration of the resistance measurement circuit 42 in FIG. 7.

The resistance measurement circuit 42 includes a buffer circuit 51, a current amplification circuit 52, and a current detector 53. The buffer circuit 51 includes an amplifier AP1 and a transistor M11. The amplifier AP1 functions as a regulator and generates voltage corresponding to voltage VSRC input to a negative polarity input end. The generated voltage is supplied to a gate of the transistor M11. The transistor M11, a source of which is connected to a power source line and to the gate of which the output from the amplifier AP1 is applied, functions as a current source. Current Ichg based on the output from the amplifier AP1 is generated at a drain of the transistor M1. Drain voltage RC_OUT of the transistor M11 is fed back to a positive polarity input end of the amplifier AP1 and stepped up to voltage equal to the voltage VSRC. The voltage RC_OUT is connected to a control signal line at resistance measurement, and Ichg is corresponding charging current.

The current amplification circuit 52 includes transistors M12 to M17. The transistor M12 has a source connected to the power source line, a gate to which the output from the amplifier AP1 is applied, and a drain at which the current Ichg is generated based on the output from the amplifier AP1. The drain of the transistor M12 is connected to a reference potential point through a current path of the transistor M13.

A gate of the transistor M13 is connected to a drain of the transistor M13 and connected to gates of the transistors M14 and M15 in common. The transistor M14 has a drain connected to a negative polarity input end of an amplifier CP1 configured as the current detector 53 through a current path of the transistor M16, and a source connected to the reference potential point. The transistor M15 has a drain connected to the negative polarity input end of the amplifier CP1 configured as the current detector 53 through a current path of the transistor M17, and a source connected to the reference potential point. Control signals from the logic circuit 43 are provided to gates of the transistors M16 and M17.

The transistors M13 to M15 form a current mirror circuit. The above-described charging current Ichg of a control signal line flows to the current path of the transistor M13, and the same current Ichg flows to a current path of the transistor M14. Current (Ichg×e) as multiplication of the current Ichg by e (the base of natural logarithm (Napierian logarithm)) flows to a current path of the transistor M15.

The logic circuit 43 generates control signals to be provided to the gates of the transistors M16 and M17. When the logic circuit 43 turns on the transistor M16 and turns off the transistor M17, drain current from the transistor M14 is supplied to the negative polarity input end of the amplifier CP1 configured as the current detector 53. When the logic circuit 43 turns on the transistor M17 and turns off the transistor M16, drain current from the transistor M15 is supplied to the negative polarity input end of the amplifier CP1 configured as the current detector 53.

Constant comparison current IREF is supplied from a reference current generation source 54 to a positive polarity input end of the amplifier CP1 configured as the current detector 53. The amplifier CP1 compares current from the current amplification circuit 52 with the comparison current IREF from the reference current generation source 54, detects a time point at which the current reaches the comparison current, and outputs a detection result FLG to the logic circuit 43. The logic circuit 43 generates, in accordance with the detection result FLG, control signals for controlling the transistors M16 and M17, and measures time by counting a reference clock.

Figure 9:
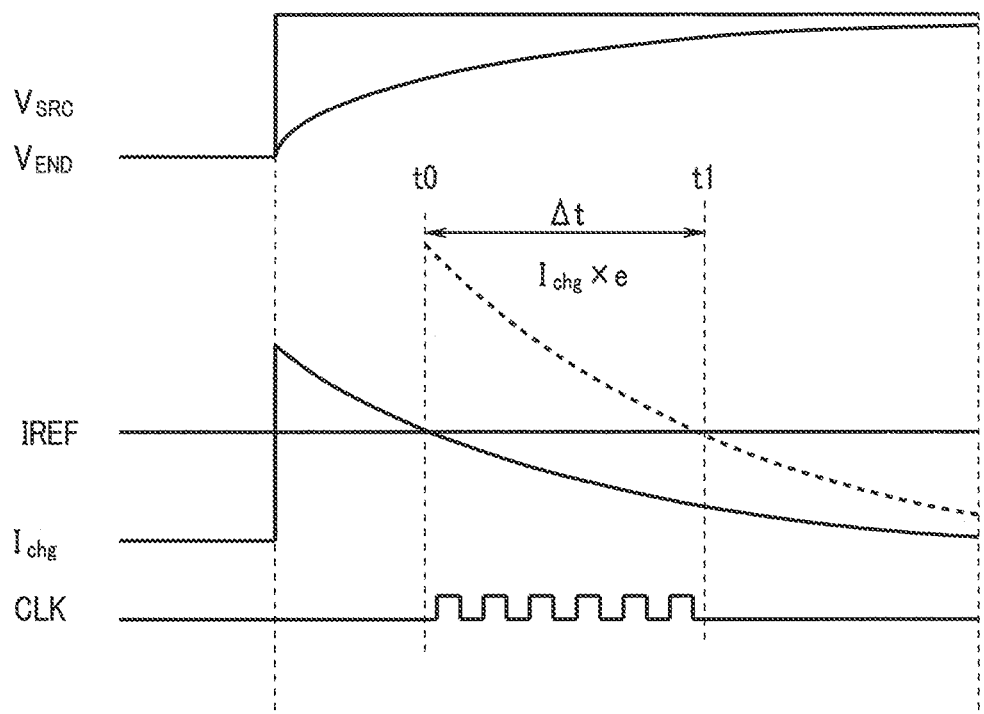
FIG. 9 is a graph for description of resistance measurement of a control signal line by the resistance measurement circuit 42 and a logic circuit 43.
Figure 10:
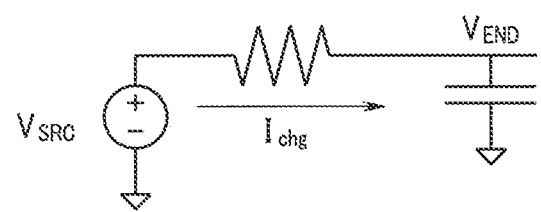
FIG. 10 is a circuit diagram illustrating an equivalent circuit of the control signal line.

FIG. 9 is a graph for description of resistance measurement of a control signal line by the resistance measurement circuit 42 and the logic circuit 43, and FIG. 10 is a circuit diagram illustrating an equivalent circuit of the control signal line.

As illustrated in FIG. 10, a control signal line such as the select gate line SGD or SGS or a word line WL can be expressed as an equivalent circuit of a resistor and a capacitor. FIG. 10 illustrates a circuit in which voltage VSRC from a voltage source is applied to one end of the control signal line.

In FIG. 9, VSRC indicates the voltage VSRC generated by the voltage source illustrated in the equivalent circuit in FIG. 10. Since the control signal line includes resistor and capacitor components, a voltage value of voltage VEND at a far end (end) of the control signal line does not steeply increase but gradually increases due to influence of the resistor and capacitor of the control signal line as illustrated with VEND in FIG. 9. Current Ichg that charges the control signal line rises at a timing of application of the voltage VSRC and gradually decreases in accordance with a time constant corresponding to values of the resistor and capacitor of the control signal line.

Thus, the charging current Ichg(t) of the control signal line along with time elapse can be expressed as Equation (1) below, where R and C represent the values of the resistor and capacitor, respectively, of the control signal line and A represents a constant.

$$\text{Ichg}(t) = A \times e^{(-t/RC)} \quad (1)$$

Equation (2) below is obtained from Equation (1).

$$t = RC \times \ln(A/\text{Ichg}(t)) \quad (2)$$

As illustrated in FIG. 9, at a time point of attenuation to the comparison current IREF a predetermined time after the rise of the current Ichg, the transistor M16 is turned off and the transistor M17 is turned on in the current amplification circuit 52, and a negative polarity input of the amplifier CP1 switches to current (Ichg×e) obtained by amplifying the charging current of the control signal line by e. The amplified current gradually decreases in accordance with a time constant corresponding to the values of the resistor and capacitor of the control signal line as illustrated in FIG. 9.

A dashed line in FIG. 9 illustrates change of the charging current Ichg(t)×e in this case. In the graph, t0 represents a time point at which the charging current Ichg(t) based on the current Ichg reaches the comparison current IREF as constant current, t1 represents a time point at which Ichg(t)×e obtained by amplifying the charging current reaches the comparison current IREF, and Δt represents a time period from the time point t0 to the time point t1. The time period Δt is expressed as Equation (3) below by using Equation (2) above, where Ichg(t0) and Ichg(t1) represent the charging current at the time points t0 and t1, respectively.

$$\Delta t = RC \times \ln(A/\text{Ichg}(t1)) - RC \times \ln(A/\text{Ichg}(t0)) = \quad (3)$$
$$RC \times \{\ln(A/\text{Ichg}(t1)) - \ln(A/\text{Ichg}(t0))\} = RC \times \ln(\text{Ichg}(t0))/(\text{Ichg}(t1))$$

Since Ichg(t0)=IREF=Ichg(t1)×e, Equation (4) below is obtained through substitution into Equation (3).

$$\Delta t = RC \quad (4)$$

Equation (4) above indicates that Δt is a value in proportional to resistance of the control signal line. The logic circuit 43 calculates Δt by controlling the transistors M16 and M17 of the current amplification circuit 52.

The logic circuit 43 first turns on the transistor M16 and turns off the transistor M17. The amplifier CP1 of the current detector 53 compares Ichg(t) with the comparison current IREF to detect a timing of the time point t0 at which Ichg(t)

becomes Ichg(t0)=IREF. The amplifier CP1 outputs the detection result FLG to the logic circuit 43. At a timing of the detection result FLG at the time point t0 from the amplifier CP1, the logic circuit 43 starts counting, turns on the transistor M17, and turns off the transistor M16.

Accordingly, the negative polarity input of the amplifier CP1 of the current detector 53 switches to Ichg(t)×e, and simultaneously, a timing of the time point t1 at which Ichg(t)×e becomes Ichg(t1)×e=IREF is detected through comparison with the comparison current IREF. The amplifier CP1 outputs the detection result FLG at the time point t1 to the logic circuit 43. The logic circuit 43 stops counting at a timing of the detection result FLG from the amplifier CP1. The logic circuit 43 outputs a count value into the register 26 or the like.

The sequencer 27 receives information of the count value from the logic circuit 43 and compares the count value with a predetermined threshold value stored in the register 26 or the like inside the non-volatile memory in advance. When the count value is larger than the threshold value, the sequencer 27 determines that the resistance of the control signal line is high. In this case, even if the pass status is obtained in erase verify, the pass status is changed to the fail status, and status information is stored in the register. The status information stored in the register is forwarded to the host at a predetermined timing.

(Effects)

Subsequently, operation of the embodiment thus configured will be described below with reference to a flowchart in FIG. 11. FIG. 11 illustrates a process for determining the status of erase verify.

In the present embodiment, high resistance of a control signal line is detected to determine the status of erase verify. The high-resistance detection is performed in a case of the pass status after erase verify.

At erase, the sequencer 27 controls each component of the non-volatile memory 2 in accordance with the process illustrated in FIG. 11. Specifically, at step S1 in FIG. 11, the sequencer 27 controls the voltage generation circuit 28 to generate a high-voltage erase pulse and apply the erase pulse to the select gate line SGS. Accordingly, electric charge accumulated in the charge accumulation film 336 of each memory cell transistor MT of each NAND string NS in a target block BLK is discharged.

Subsequently at step S2, the sequencer 27 performs erase verify to check whether the threshold voltage of each memory cell transistor MT has become the Er state. The sequencer 27 controls the voltage generation circuit 28 to generate voltage necessary for erase verify and supply the voltage to the memory cell array 23, the sense amplifier 24, and the row decoder 25.

First, through the row decoder 25, the sequencer 27 turns on the select gate transistor ST2 by providing the voltage VSGS, turns on the select gate transistor ST1 of a target NAND string NS by providing the voltage VSGD, and applies the erase verify voltage VCG_ER to the gate of each memory cell transistor MT. In addition, through the sense amplifier 24, the sequencer 27 fixes a bit line BL to constant voltage (for example, 0.5 V) and charges the voltage of a sense node SEN to predetermined precharge voltage Vpre.

When the threshold voltage of each memory cell transistor MT of the target NAND string NS is at the Er state, the memory cell transistor MT becomes the "on" state, large cell current flows to the memory cell transistor MT, and the voltage of a sense node SEN connected to a predetermined bit line BL decreases at relatively high speed. Thus, in this case, the sense node SEN has voltage lower than a predetermined threshold value at a relatively early predetermined timing.

When the threshold voltage of any memory cell transistor MT of the target NAND string NS has not returned to the Er state, the memory cell transistor MT is in the "off" state, and the voltage of the sense node SEN connected to the predetermined bit line BL decreases at low speed. Thus, in this case, the sense node SEN remains at voltage equal to or higher than the predetermined threshold value at the relatively early predetermined timing.

When the sense node SEN has voltage lower than the predetermined threshold value at the predetermined timing, the sense amplifier 24 obtains a determination result indicating that erase at the memory cell transistors MT of the NAND string NS connected to the bit line BL connected to the sense node SEN is successful (erase verify pass). When the sense node SEN has voltage equal to or higher than the predetermined threshold value, the sense amplifier 24 obtains a determination result indicating that erase at the memory cell transistors MT of the NAND string NS is unsuccessful (erase verify fail). The sense amplifier 24 outputs the successful or unsuccessful determination result to the sequencer 27.

The sequencer 27 determines whether verify results obtained for all NAND strings NS indicate successful erase (erase verify pass) (S3). When all results are successful, the sequencer 27 determines that erase is successful. Otherwise, the sequencer 27 returns processing to step S1 and repeats erase and erase verify. Note that, in this case, erase and erase verify are performed only for any NAND string NS for which erase verify fail is obtained.

When erase verify fail is obtained after processing at steps S1 and S2 is repeated more than a predetermined number of times, the sequencer 27 sets the fail status for erase verify at step S7. When the sequencer 27 has acquired the pass status of the erase verify pass at step S3, the sequencer 27 performs resistance measurement of a control signal line at next step S4.

The sequencer 27 may select, for example, the select gate line SGS as a control signal line to be measured. Due to a manufacturing process, a defect that would cause high resistance is likely to occur to the select gate line SGS of a lowermost layer in a three-dimensional stereoscopic structure among control signal lines. For this reason, the sequencer 27 sets the select gate line SGS as a high-resistance detection target. Note that the sequencer 27 may set the high-resistance detection target to be a select gate line SGD of an uppermost layer in the three-dimensional stereoscopic structure among control signal lines, or may set the high-resistance detection target to be any word line WL. Alternatively, the sequencer 27 may set the high-resistance detection target to be a plurality of control signal lines.

The resistance measurement circuit 42 supplies the measurement voltage RC_OUT to a control signal line under control of the sequencer 27 so that the charging current flows to the control signal line. In this case, voltage of the memory cell array at the row decoder, the sense amplifier, and the like is desirably same as voltage in reading operation. The current detector 53 in the resistance measurement circuit 42 outputs the detection result FLG to the logic circuit 43 at a timing when the charging current Ichg(t) becomes equal to the comparison current IREF. The logic circuit 43 controls the current amplification circuit 52 to change negative polarity input current of the amplifier CP1 of the current detector 53 to the charging current of the control signal line times e. The current detector 53 outputs the detection result FLG to the logic circuit 43 at a timing when the charging current Ichg(t)×e reaches the comparison current IREF again. The logic circuit 43 counts a duration between the two detection results FLG and outputs a count result, in other words, a value corresponding to a resistance value of the control signal line to be measured to the sequencer 27.

The sequencer 27 receives information of the count value from the logic circuit 43 and compares the count value with a predetermined threshold value stored in the register 26 or the like inside the non-volatile memory in advance. When the count value is larger than the threshold value, the sequencer 27 determines that resistance of the control signal line is high (step S5). In this case, even if the pass status is obtained in erase verify, the pass status is changed to the fail status and status information is stored in the register (step S7). When it is determined that the count value is equal to or smaller than the predetermined threshold value, in other words, when it is determined that the resistance value of the control signal line to be measured is a resistance value in a normal range, the pass status indicating that erase verify is successful is recorded in the register (S6). The status information stored in the register is forwarded to the host at a predetermined timing.

In the present embodiment as described above, resistance of a control signal line such as a word line is measured, and an erase status is determined based on a measurement result. Accordingly, when the pass status of erase verify is obtained but the resistance of the control signal line is high, the status of erase verify can be changed to the fail status, thereby preventing occurrence of defective read due to the high resistance of the control signal line.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
a memory block including a plurality of memory strings, a first control signal line, a plurality of second control signal lines, a third control signal line, and a plurality of bit lines, the plurality of memory strings each including a first select gate transistor, a plurality of memory cell transistors, and a second select gate transistor that are connected in series, the first control signal line being connected to a gate of the first select gate transistor of each of the plurality of memory strings in common, the plurality of second control signal lines each being connected to gates of the memory cell transistors of the plurality of memory strings on a corresponding row in common, the third control signal line being connected to a gate of the second select gate transistor of each of the plurality of memory strings in common, the plurality of bit lines being connected to the plurality of memory strings;
a resistance measurement circuit configured to measure resistance of at least one control signal line among the first control signal line, the second control signal lines, and the third control signal line; and
a control circuit configured to perform erase, program, and read of data at the plurality of memory cell transistors included in the memory block, wherein
the control circuit determines, based on a measurement result of the resistance measurement by the resistance measurement circuit, whether to set a fail status to a result of erase verify that verifies the erase.

2. The semiconductor storage device according to claim 1, wherein
the memory block has a stereoscopic structure, and
the control circuit determines, as a target of the resistance measurement, a control signal line of a lowermost or uppermost layer of the memory block among the first control signal line, the second control signal lines, and the third control signal line.

3. The semiconductor storage device according to claim 1, wherein
the memory block has a stereoscopic structure, and
the control circuit determines, as a target of the resistance measurement, the second control signal lines.

4. The semiconductor storage device according to claim 1, wherein the control circuit determines, as a target of the resistance measurement, a plurality of control signal lines among the first control signal line, the second control signal lines, and the third control signal line.

5. The semiconductor storage device according to claim 1, wherein the control circuit performs the resistance measurement before the program after the erase.

6. The semiconductor storage device according to claim 1, wherein the control circuit determines whether to change the result of the erase verify based on the measurement result of the resistance measurement by the resistance measurement circuit when a pass status is obtained by the erase verify that verifies the erase.

7. The semiconductor storage device according to claim 1, wherein the control circuit determines whether or not to change the result of the erase verify by comparing the measurement result of the resistance measurement with a threshold value.

8. The semiconductor storage device according to claim 7, wherein the memory block records the threshold value in a particular region.

9. The semiconductor storage device according to claim 1, wherein the control circuit forwards the result of the erase verify to a host.

10. The semiconductor storage device according to claim 1, wherein the control circuit can set whether to perform determination processing of the fail status based on the measurement result of the resistance measurement.

11. The semiconductor storage device according to claim 1, wherein the resistance measurement circuit includes
a voltage generation circuit configured to apply voltage to the at least one control signal line to be measured,
an amplification circuit configured to be able to amplify first charging current that charges the at least one control signal line to be measured to obtain second charging current and supply the second charging current to the at least one control signal line to be measured, and
a logic circuit configured to calculate resistance of the at least one control signal line to be measured by calculating a time period from a time point at which the first charging current reaches a first current value to a time point at which the second charging current reaches the first current value.

12. An erase verification method of verifying erase of a memory block including a plurality of memory strings, a first control signal line, a plurality of second control signal lines, a third control signal line, and a plurality of bit lines, the plurality of memory strings each including a first select gate transistor, a plurality of memory cell transistors, and a second select gate transistor that are connected in series, the first control signal line being connected to a gate of the first select gate transistor of each of the plurality of memory strings in common, the plurality of second control signal lines each being connected to gates of the memory cell transistors of the plurality of memory strings on a corresponding row in common, the third control signal line being connected to a gate of the second select gate transistor of each of the plurality of memory strings in common, the plurality of bit lines being connected to the plurality of memory strings, the erase verification method comprising:

- measuring, by a resistance measurement circuit, resistance of at least one control signal line among the first control signal line, the second control signal lines, and the third control signal line before program after the erase; and
- determining, by a control circuit, based on a measurement result of the resistance measurement by the resistance measurement circuit, whether to set a fail status to a result of erase verify that verifies the erase.

13. The erase verification method according to claim 12, wherein the control circuit determines whether to change the result of the erase verify based on the measurement result of the resistance measurement by the resistance measurement circuit when a pass status is obtained by the erase verify that verifies the erase.

* * * * *